United States Patent
Ma et al.

[11] Patent Number: 5,854,128
[45] Date of Patent: Dec. 29, 1998

[54] METHOD FOR REDUCING CAPACITIVE COUPLING BETWEEN CONDUCTIVE LINES

[75] Inventors: Kin F. Ma; Eric T. Stubbs, both of Boise, Id.

[73] Assignee: Micron Technology, Inc., Boise, Id.

[21] Appl. No.: 641,154

[22] Filed: Apr. 29, 1996

[51] Int. Cl.$^6$ ............................................. H01L 21/4763
[52] U.S. Cl. ...................... 438/631; 438/620; 438/598; 438/637; 438/666; 438/669
[58] Field of Search ...................... 438/589, 669, 438/631, 598, 618, 620, 666, 671, 637, 672, 622, 623, 624

[56] References Cited

U.S. PATENT DOCUMENTS

| | | | |
|---|---|---|---|
| 3,945,647 | 3/1976 | Takemoto et al. | 438/631 |
| 4,497,890 | 2/1985 | Helbert | 438/669 |
| 4,585,515 | 4/1986 | Maa | 438/664 |
| 4,789,648 | 12/1988 | Chow et al. | 438/637 |
| 4,801,554 | 1/1989 | Gobrecht et al. | 438/666 |
| 4,933,303 | 6/1990 | Mo | 438/631 |
| 5,266,521 | 11/1993 | Lee et al. | 438/653 |
| 5,346,587 | 9/1994 | Doan et al. | 438/592 |
| 5,529,955 | 6/1996 | Hibino et al. | 438/683 |
| 5,561,082 | 10/1996 | Matsuo et al. | 438/396 |
| 5,627,094 | 5/1997 | Chan et al. | 438/396 |

*Primary Examiner*—John Niebling
*Assistant Examiner*—Lynne A. Gurley

[57] ABSTRACT

An embodiment of the present invention discloses a memory device having an array with digit lines arranged in complementary pairs, the array comprising; a substantially planar layer having trenches therein; a first level of digit lines residing at least partially in the trenches; a second level of digit lines residing on the surface of the layer, the second level extending in generally parallel relation to the digit lines in the first level. The first level of digit lines are in alternating positions with the second level of digit lines and the alternating positions comprise a repeating pattern of a first complementary pair of digit lines at the first level adjacent a second complementary pair of digit lines at the second level.

15 Claims, 2 Drawing Sheets

METHOD FOR REDUCING CAPACITIVE COUPLING BETWEEN CONDUCTIVE LINES

FIELD OF THE INVENTION

This invention relates to conductive lines for semiconductor devices and particularly to metal lines for semiconductor memory devices.

BACKGROUND OF THE INVENTION

In semiconductor devices, conductive lines are used to interconnect between various devices or circuitry and or both. For example, power buses are typically made of a metal that is capable of carrying the required current necessary to operate the device.

In a semiconductor memory device, besides metal power buses, the memory array is interconnected by a grid of column (digit or bit) and row (word) lines. The word lines are typically made of polysilicon, topped with a metal silicide, while the bit lines comprise some form of metal.

The bit lines, in a memory array, run basically perpendicular to the word lines and in a parallel fashion to one another. A common characteristic between neighboring bit lines is the capacitive coupling that exists. Digit lines need to be at a specific precharge voltage in order to be read correctly during memory cell sensing. Since there is a capacitive coupling component between neighboring conductors, when a neighboring line is pulled high or low it can couple a digit line above or below the precharge voltage, thus affecting the device's ability to sense data correctly. As memory arrays become denser, the bit lines are crowded even closer together which in turn will increase the capacitive coupling.

It is desirable to reduce the capacitive coupling between conductive lines and in particular between neighboring bits lines of a memory array in order to provide a more efficient array. The present invention discloses a conductive line arrangement that may be used in any semiconductor device that uses substantially parallel conductors, such as in the memory array or a memory device, or the like, that indeed reduces capacitive coupling between neighboring lines (i.e., neighboring bits lines in a memory array).

SUMMARY OF THE INVENTION

A general embodiment of the present invention discloses a semiconductor device having conductive lines, where a first portion of the conductive lines are at a first level and a second portion of the conductive lines are at a second, vertically offset level to the first level, the second level extending in generally parallel relation to the first level.

A method to form the above structure comprises the steps of:

forming a first portion of the conductive lines at a first level; forming a second portion of the conductive lines at a second, vertically offset level to the first level; wherein the second level extends in generally parallel relation to the first level.

Another embodiment discloses a two level conductive structure fabricated in a semiconductor device, the structure comprising;

a suitable layer having trenches therein; a first level of conductive lines residing at least partially in the trenches; a second level of conductive lines, the second level of conductive lines having a major portion protruding above the surface of the layer and extending in generally parallel relation to the first level of conductive lines.

A method to form the two level conductive structure above comprises the steps of:

forming a plurality of trenches in a suitable layer; forming a conductive layer over the suitable layer, thereby at least partially filling the trenches; patterning the conductive layer to form a first and second level of conductive lines vertically offset from one another.

DETAILED DESCRIPTION OF THE DRAWINGS

A first embodiment of the present invention of single alternating conductive lines, vertically offset from one another, is depicted in FIGS. 1–4.

Figure 1:
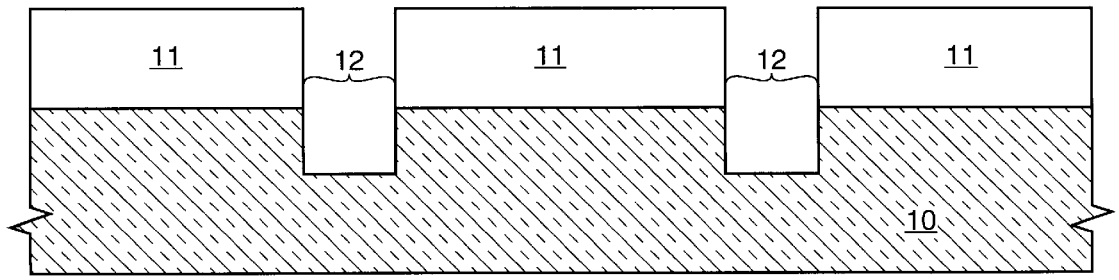
FIGS. 1–4 depict exemplary process steps in an implementation of the invention to form single alternating conductive lines in accordance with the present invention (as shown in FIG. 4)

FIG. 1, shows the process stage of a wafer with the beginning steps to form a plurality of conductive lines for a semiconductor device. First a substantially planar layer 10 is patterned using patterning material 11 (such as photoresist) and etched to form a plurality of trenches 12 in the planar layer. Though it is not necessary that layer 10 be substantially planar it is highly desirable which will become evident as discussed later in the process. Also, layer 10 may be made up of an insulating material, such as an oxide, a silicon material or any suitable material a particular process may use to construct the structure of the present invention. If a material other than an insulator is used to form layer 10, then some type of corformal insulator should be formed over layer 10 after patterning material 11 is removed and prior to forming a conductive layer over layer 10.

Figure 2:
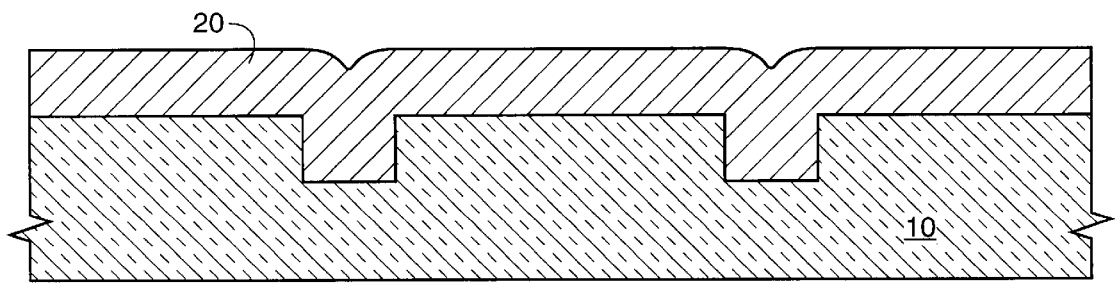

Referring now to FIG. 2, patterning material 11 shown in FIG. 1 is removed and a conductive layer 20 is formed over the surface of layer 10, which at least partially fills trenches 12. For example, conductive layer 20 may be a sputtered aluminum.

Figure 3:
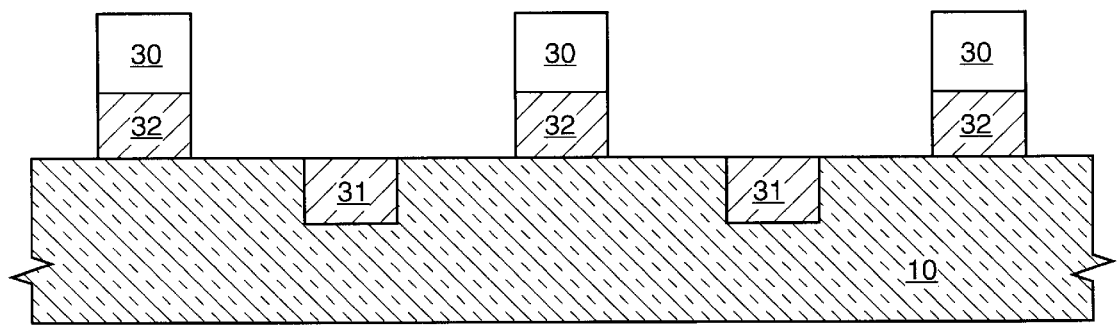

Referring now to FIG. 3, patterning material 30 is formed so that a subsequent etch creates a plurality of conductive lines with a single conductive line 31 formed in each trench 12 and conductive lines 32 formed on the surface of layer 10 where a major portion of each conductive line 32 protrudes above the surface of layer 10.

Figure 4:
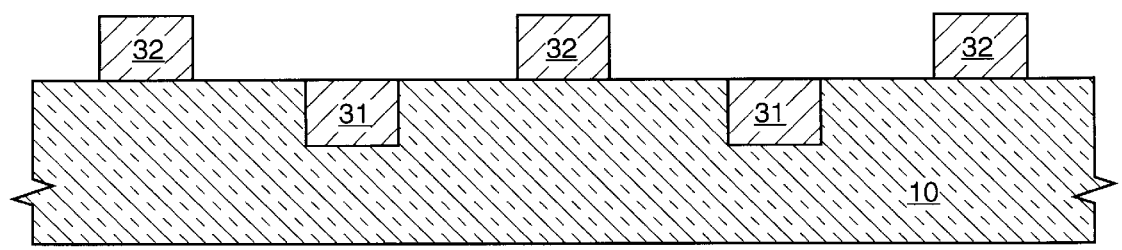

As FIG. 4 shows, patterning material 30 (seen in FIG. 3) has been removed, leaving behind conductive lines 31 and 32 arranged in an alternating pattern. This arrangement of conductive lines may be a recurring pattern of alternating conductive lines. The alternating arrangement helps to reduce capacitive coupling between neighboring conductive lines, since capacitance is proportional to the parallel coupling area between lines 31 and 32. In order to gain the benefit of the reduced capacitive coupling it is important that the conductive lines formed in the trenches are residing at least partially in the trenches. The conductive lines formed on the surface of layer 10 extend in a generally parallel relation to the conductive lines formed at least partially in the trenches.

A second embodiment of the present invention of double alternating conductive lines vertically offset from one another is depicted in FIGS. 5–8.

Figure 5:
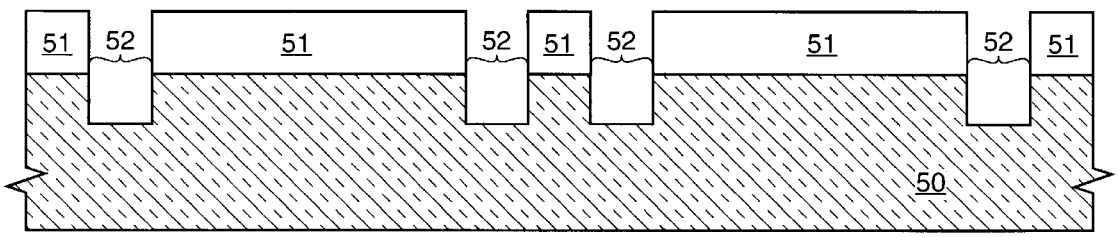
FIGS. 5–8 depict exemplary process steps in an implementation of the invention to form double alternating conductive lines in accordance with the present invention (as shown in FIG. 8).

FIG. 5, shows the process stage of a wafer at which the beginning steps to form double conductive lines for a semiconductor device are integrated. First, a substantially planar layer 50 is patterned using patterning material 51 (such as photoresist) and etched to form a plurality of trenches 52 in the planar layer. As in the first embodiment, though it is not necessary that layer 50 be substantially planar it is highly desirable as will be discussed later in the process. Also, layer 50 may be made up of an insulating material, a silicon material or any suitable material a particular process may use to construct the structure of the present invention. If a material other than an insulator is used to form layer 50, then some type of conformal insulator should be formed over layer 50 after patterning material 51 is removed and prior to forming a conductive layer over layer 50.

Figure 6:
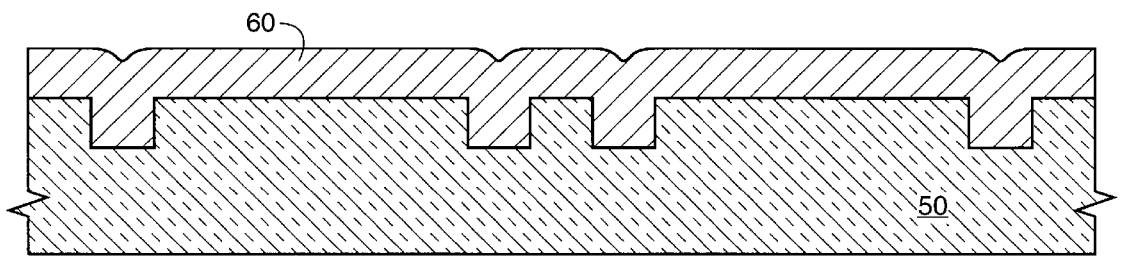

Referring now to FIG. 6, patterning material 51 (shown in FIG. 5) is removed and a conductive layer 60 is formed over the surface of layer 50, which at least partially fills trenches 52. For example, conductive layer 60 may be a sputtered aluminum.

Figure 7:
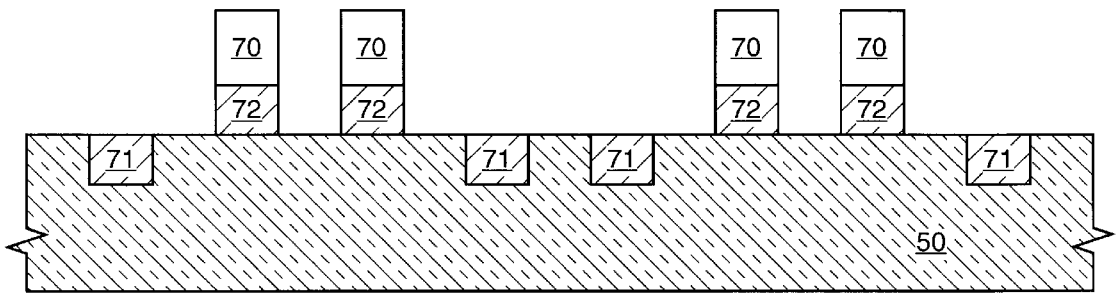

Referring now to FIG. 7, patterning material 70 (such as photoresist) is formed so that a subsequent etch creates a plurality of conductive lines with a first set of single conductive lines 71, each single conductive line formed in an individual trench 52 and a second set of conductive lines 72 formed on the surface of layer 50.

Figure 8:
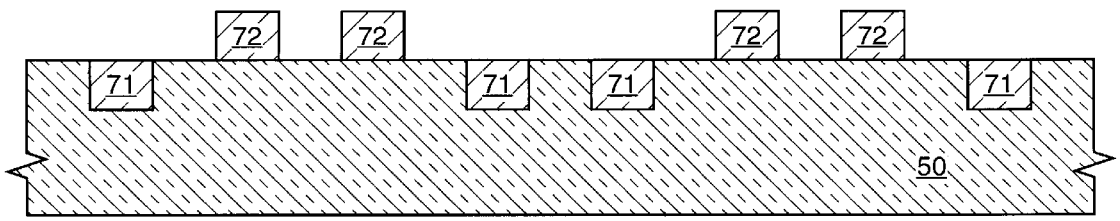

As FIG. 8 shows the patterning material 70 (seen in FIG. 7) has been removed, leaving behind conductive lines 71 and 72 arranged in an alternating pattern. This arrangement of conductive lines may be a reoccurring pattern of alternating conductive lines. This alternating arrangement helps to reduce capacitive coupling between neighboring conductive lines. In order to gain the benefit of the reduced capacitive coupling it is important that the conductive lines formed in the trenches are residing at least partially in the trenches. The conductive lines formed on the surface of layer 50 extend in generally parallel relation to the conductive lines formed at least partially in the trenches.

In the embodiments described above, the generally parallel relationship between the conductive lines is intended to include conductive lines oriented such that they travel in basically the same direction in the semiconductor device. The lines may follow each others' contour in the strict sense of being parallel or, for example, as in the case of a memory device, the conductive lines (the digit lines) extend in the same direction and yet they may bow away from each other for a distance and then come back together. Furthermore, the generally parallel relationship is also intended to include twisted neighboring digits lines. In light of the present invention, the digit line on the surface of the layer (either 10 or 50) may at some point cross over a trench embedded digit line. Then it may run along side the trench, cross back over the trench embedded digit line and once again run along side the trench. (This pattern may or may not repeat depending on the desired layout.)

In a specific application of the present invention, conductive lines make up the digit lines of a semiconductor memory device, such as a dynamic random access memory device. Typically, digit lines in this type of application are made from metal, so in order to avoid problems associated with metals, such as poor step coverage or electromigration, it is highly desirable to form the metal lines on a substantially planar surface. Each digit line will have a complementary digit line as its neighbor (also referred to as complementary pairs).

In one embodiment the complementary pairs are arranged so that one leg of the complementary pair is at least partially embedded in an insulating layer and the other leg resides on the surface of the insulating layer.

Data is sensed by comparing two digit lines (or complementary pairs). If the two digit lines in a complementary pair have different characteristics (i.e., the way they are formed, how they are oriented to their nearest neighbor, etc.) the pair will be inherently unbalanced. This could lead to one digit line being more prone to failure (incorrect data sensing) than the other digit line in the pair. In a second embodiment the complementary pairs are arranged so that both legs of a first pair are at least partially embedded in an insulating layer and both legs of the second pair reside on the surface of the insulating layer. In this case, the complementary pairs are more evenly matched to avoid the problems mentioned above of an unbalanced complementary pair.

Whichever structure is being formed, the formations of either of these embodiments is taught such that a single conductive layer (i.e., metal for digit lines, such as a sputter aluminum) is used to form conductive lines at two different levels on the semiconductor device. Also, though the embodiments teach single alternating and double alternating conductive lines, the principles taught will allow one to construct triple, quadruple, etc., alternating sets of conductive lines, though the benefit of reduced capacitive coupling between the conductive lines will diminish as the number increases.

It is to be understood that although the present invention has been described with reference to several preferred embodiments, various modifications, known to those skilled in the art, may be made to the process steps presented herein without departing from the invention as recited in the several claims appended hereto.

What is claimed is:

1. A method for forming a plurality of conductive lines for a semiconductor device, said process comprising the steps of:

forming a planar insulating layer;

forming a plurality of trenches in said planar insulating layer, each trench having a height defined by sidewalls and a width spanning said sidewalls;

forming a conductive layer over the surface of said planar insulating layer and thereby filling said trenches;

removing sections of said conductive layer to simultaneously form a first set of conductive lines and a second set of conductive lines, said first set of conductive lines formed from a plurality of individual conductive lines, each conductive line residing at least partially in and making contact to the sidewalls of a corresponding trench, said second set of conductive lines formed from a plurality of individual conductive lines residing on the surface of said planar insulating layer, said first and second sets of conductive lines being patterned in a repeating alternating pattern such that said second set of conductive lines are completely vertically offset from said first set of conductive lines and wherein the bottom surfaces of said second set of conductive lines are no lower than the top surfaces of said first set of conductive lines.

2. The method of claim 1, wherein said first and second conductive lines are patterned such that an alternating pattern of said first and second conductive lines comprises a pair of conductive lines of said first set of conductive lines residing adjacent a pair of conductive lines of said second set of conductive lines occurring in said repeating pattern.

3. The method of claim 1, wherein said first and second conductive lines are patterned such that an alternating pattern of said first and second conductive lines comprises a single conductive line of said first set of conductive lines residing adjacent a single conductive line of said second set of conductive lines occurring in said repeating pattern.

4. A method of forming a two level conductive structure fabricated in a semiconductor device, said method comprising:

forming a planar insulating layer having trenches therein, each trench having a height defined by sidewalls and a width spanning said sidewalls;

forming a conductive layer over the surface of said planar insulating layer and thereby filling said trenches;

forming a first level of conductive lines residing at least partially in and making contact to the sidewalls of a corresponding trench; and simultaneously forming a second level of conductive lines residing on the surface of said insulating layer by removing portions of said conductive layer, said first and second levels of conductive lines being patterned in alternating positions in a repeating pattern such that said second level of conductive lines are completely vertically offset from said first level of conductive lines and wherein the bottom surfaces of said second level of conductive lines are no lower than the top surfaces of said first level of conductive lines.

5. The method of claim 4, wherein said alternating positions comprise a single conductive line of said first level of conductive lines residing adjacent a single conductive line of said second level of conductive lines, said conductive lines occurring in said repeating pattern.

6. The method of claim 4, wherein said alternating positions comprise a pair of conductive lines of said first level of conductive lines residing adjacent a pair of conductive lines of said second level of conductive lines, said pair of conductive lines occurring in said repeating pattern.

7. A method of forming a two level conductive structure fabricated in a semiconductor device, said method comprising:

forming a planar insulating layer having trenches therein;

forming a conductive layer over the surface of said planar insulating layer and thereby filling said trenches;

forming a plurality of conductive lines at a first level, each conductive line of said first level residing at least partially in a corresponding trench; and simultaneously forming a plurality of conductive lines at a second level by removing portions of said conductive layer, each conductive line of said second level extending alongside said conductive lines of said first level, but completely vertically offset from said lines of said first level, said first and second levels of conductive lines being patterned in alternating positions in a repeating pattern;

wherein the bottom surfaces of said plurality of conductive lines at a second level is no lower than the top surfaces of said plurality of conductive lines of said first level.

8. The method of claim 7, wherein said two level conductive structure comprises a plurality of alternating conductive lines of said first level and said second level.

9. The method of claim 8, wherein said alternating positions comprise a single conductive line of said first level of conductive lines residing adjacent a single conductive line of said second level of conductive lines, said conductive lines occurring in said repeating pattern.

10. The method of claim 8, wherein said alternating positions comprise a pair of conductive lines of said first level of conductive lines residing adjacent a pair of conductive lines of said second level of conductive lines, said pair of conductive lines occurring in said repeating pattern.

11. A method for forming a memory device having digit lines, comprising the steps of:

forming a planar insulating layer having trenches therein;

forming a conductive layer over the surface of said planar insulating layer and thereby filling said trenches;

forming a first set of conductive digit lines having upper and lower surfaces, each conductive digit line of said first set residing at least partially in a corresponding trench; and simultaneously forming a second set of conductive digit lines having upper and lower surfaces by removing portions of said conductive layer, each conductive digit line of said second set extending alongside said conductive digit lines of said first set such that said second set of conductive digit lines are completely vertically offset from said first set of conductive digit lines and said first and second sets of conductive digit lines are patterned in alternating positions in a repeating pattern;

wherein the lower surfaces of said conductive digit lines of said second set are no lower than the upper surfaces of said conductive digit lines of said first set.

12. The method of claim 11, wherein a repeating pattern of complementary pairs of digit lines are formed of a digit line from said first set and a digit line of said second set.

13. The method of claim 11, wherein said method comprises a semiconductor memory device fabrication process.

14. The method of claim 11, wherein said conductive digit lines comprise metal.

15. A method of forming a structure fabricated in a semiconductor device, said method comprising:

forming a planar insulating layer having at least one trench therein;

forming a conductive layer over the surface of said planar insulating layer and thereby filling said at least one trench;

forming at least one trench conductive line within said at least one trench, each trench conductive line having a top surface and a bottom surface; and simultaneously forming at least one conductive line on said insulating layer by removing portions of said conductive layer, each conductive line having a top surface and a bottom surface;

wherein, said at least one trench conductive line and said at least one conductive line are patterned in alternating positions in a repeating pattern such that said at least one conductive line is completely vertically offset from said at least one trench conductive line and the bottom surface of each said conductive line is no lower than the top surface of each said trench conductive line.

* * * * *